(12) United States Patent
Fukui et al.

(10) Patent No.: US 9,337,271 B2
(45) Date of Patent: May 10, 2016

(54) SILICON-CARBIDE SEMICONDUCTOR DEVICE AND MANUFACTURING METHOD THEREFOR

(71) Applicant: Mitsubishi Electric Corporation, Chiyoda-ku (JP)

(72) Inventors: Yutaka Fukui, Tokyo (JP); Yasuhiro Kagawa, Tokyo (JP); Rina Tanaka, Tokyo (JP); Yuji Abe, Tokyo (JP); Masayuki Imaizumi, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 0 days.

(21) Appl. No.: 14/650,413

(22) PCT Filed: Dec. 19, 2013

(86) PCT No.: PCT/JP2013/007462
§ 371 (c)(1),
(2) Date: Jun. 8, 2015

(87) PCT Pub. No.: WO2014/103257
PCT Pub. Date: Jul. 3, 2014

(65) Prior Publication Data
US 2015/0333126 A1 Nov. 19, 2015

(30) Foreign Application Priority Data
Dec. 28, 2012 (JP) ................ 2012-288407

(51) Int. Cl.
*H01L 29/10* (2006.01)
*H01L 29/423* (2006.01)
(Continued)

(52) U.S. Cl.
CPC .......... *H01L 29/1095* (2013.01); *H01L 21/047* (2013.01); *H01L 21/26586* (2013.01);
(Continued)

(58) Field of Classification Search
CPC ..... H01L 29/1095; H01L 29/12; H01L 21/28; H01L 29/78; H01L 21/26586; H01L 20/1033; H01L 29/0696; H01L 29/7813; H01L 29/045; H01L 29/66068; H01L 21/047; H01L 2/047; H01L 29/66348; H01L 29/4236; H01L 29/1045; H01L 29/1608
See application file for complete search history.

(56) References Cited

U.S. PATENT DOCUMENTS 8,395,162 B2   3/2013   Nakano et al.
8,563,981 B2   10/2013  Nakano et al.
(Continued)

FOREIGN PATENT DOCUMENTS

JP   2005 333068   12/2005
JP   2007 281265   10/2007
(Continued)

OTHER PUBLICATIONS

International Preliminary Report on Patentability and Written Opinion issued Jun. 30, 2015 in PCT/JP2013/007462 (with English language translation).
Office Action issued Oct. 6, 2015 in Japanese Patent Application No. 2014-554126 (with English language translation).
International Search Report Issued Feb. 18, 2014 in PCT/JP13/007462 Filed Dec. 19, 2013.
Yano, H. et al., "Anomalously anisotropic channel mobility on trench sidewalls in 4H—SiC trench-gate metal-oxide-semiconductor field-effect transistors fabricated on 8° off substrates", Applied Physics Letters, vol. 90, pp. 042102-042102-3, 2007.
U.S. Appl. No. 14/650,718, filed Jun. 9, 2015, Fukui, et al.

*Primary Examiner* — William Coleman
(74) *Attorney, Agent, or Firm* — Oblon, McClelland, Maier & Neustadt, L.L.P.

(57) ABSTRACT

It is an object of the present invention to provide a silicon carbide semiconductor device that reduces an influence of an off-angle of a silicon carbide substrate on characteristics of the semiconductor device and achieves improved operational stability and reduced resistance. In a trench-gate silicon carbide MOSFET semiconductor device formed on the silicon carbide semiconductor substrate having the off-angle, a low-channel doped region is provided on a first sidewall surface side of the trench in a well region, and a high-channel doped region having an effective acceptor concentration lower than that of the low-channel doped region is provided on a second sidewall surface side of the trench in the well region.

11 Claims, 12 Drawing Sheets

(51) Int. Cl.
  *H01L 29/66* (2006.01)
  *H01L 21/04* (2006.01)
  *H01L 29/739* (2006.01)
  *H01L 29/16* (2006.01)
  *H01L 29/78* (2006.01)
  *H01L 29/04* (2006.01)
  *H01L 21/265* (2006.01)
  *H01L 21/28* (2006.01)
  *H01L 29/12* (2006.01)
  *H01L 29/06* (2006.01)

(52) U.S. Cl.
  CPC .............. *H01L21/28* (2013.01); *H01L 29/045* (2013.01); *H01L 29/0696* (2013.01); *H01L 29/1033* (2013.01); *H01L 29/12* (2013.01); *H01L 29/1608* (2013.01); *H01L 29/4236* (2013.01); *H01L 29/66068* (2013.01); *H01L 29/66348* (2013.01); *H01L 29/66734* (2013.01); *H01L 29/7397* (2013.01); *H01L 29/78* (2013.01); *H01L 29/7813* (2013.01); *H01L 29/0623* (2013.01); *H01L 29/1041* (2013.01); *H01L 29/1045* (2013.01)

(56) References Cited

U.S. PATENT DOCUMENTS

| | | | |
|---|---|---|---|
| 8,686,439 | B2 | 4/2014 | Takahashi et al. |
| 8,748,901 | B1 | 6/2014 | Takahashi et al. |
| 9,012,922 | B2 * | 4/2015 | Hiyoshi .............. H01L 21/3065 257/77 |
| 2013/0285069 | A1 | 10/2013 | Yano et al. |
| 2014/0014972 | A1 | 1/2014 | Nakano et al. |

FOREIGN PATENT DOCUMENTS

| | | |
|---|---|---|
| JP | 2011 100967 | 5/2011 |
| JP | 2011-141991 | 6/2011 |
| WO | WO 2012/026089 A1 | 3/2012 |
| WO | 2013 001782 | 1/2013 |

* cited by examiner

[0001] WITH OFF-ANGLE θ

[1-100] ⊙ → [11-20] WITH OFF-ANGLE θ

[0001] WITH OFF-ANGLE θ

[1-100] → [11-20] WITH OFF-ANGLE θ

[0001] WITH OFF-ANGLE θ

[1-100] → [11-20] WITH OFF-ANGLE θ

[0001] WITH OFF-ANGLE θ
→ [11-20] WITH OFF-ANGLE θ
[1-100]

[0001] WITH OFF-ANGLE θ
→ [11-20] WITH OFF-ANGLE θ
[1-100]

[0001] WITH OFF-ANGLE θ
[1-100] → [11-20] WITH OFF-ANGLE θ

[-1100]
[0001] WITH OFF-ANGLE θ → [11-20] WITH OFF-ANGLE θ

[0001] WITH OFF-ANGLE θ
→ [11-20] WITH OFF-ANGLE θ
[1-100]

[0001] WITH OFF-ANGLE θ
→ [11-20] WITH OFF-ANGLE θ
[1-100]

SILICON-CARBIDE SEMICONDUCTOR DEVICE AND MANUFACTURING METHOD THEREFOR

TECHNICAL FIELD

The present invention relates to a silicon carbide semiconductor device and more particularly to a trench-gate silicon carbide semiconductor device used as a power semiconductor device and to a manufacturing method therefor.

BACKGROUND ART

In power electronics equipment, switching elements, such as silicon insulated gate bipolar transistors (IGBTs) and metal oxide semiconductor field effect transistors (MOSFETs), are used to switch between execution and stop of power supply for driving loads such as electric motors. Particularly in recent times, as next-generation switching devices having a high breakdown voltage and a low loss, MOSFETs including silicon carbide (SiC) receive attention.

As a power semiconductor device, a vertical MOSFET structure is often used. The vertical MOSFET includes a planar type, a trench (trench-gate) type, or the like depending on its gate structure.

When a trench-gate SiC-MOSFET is formed on a substrate having an off-angle, such as 4° off, it has been known that an on-current and a threshold voltage are changed depending on sidewall surfaces of a trench being formed (for example, Patent Document 1).

PRIOR ART DOCUMENT

Patent Document

Patent Document 1: Japanese Patent Application Laid-Open No. 2011-100967

SUMMARY OF INVENTION

Problems to be Solved by the Invention

According to Patent Document 1, in a trench-gate SiC-MOSFET formed of a 4H—SiC single-crystal semiconductor substrate having an off-angle, variations in a drain current and a threshold voltage occur in each of sidewall surfaces of a trench having different crystal surfaces due to a dependence on the off-angle. In other words, in the trench-gate SiC-MOSFET formed on the substrate having the off-angle, a MOSFET is in a different ON state in each of the sidewall surfaces of the trench, so that dynamic characteristics may become unstable or a current concentration may occur in a channel surface of the particular sidewall surface of the trench in some cases.

The present invention has been made in view of the above mentioned problems, and an object thereof is to provide a trench-gate vertical silicon carbide semiconductor device capable of reducing variations in a drain current and a threshold voltage due to crystal surfaces of sidewall surfaces of a trench and to provide a manufacturing method therefor.

Means to Solve the Problems

A silicon carbide semiconductor device of the present invention includes: a drift region of a first conductivity type that is formed on a first main surface of a silicon carbide semiconductor substrate having an off-angle and is made of silicon carbide; a well region of a second conductivity type that is formed on a surface of the drift region and is made of silicon carbide; a source region of the first conductivity type that is selectively formed in a surface layer portion of the well region and is made of silicon carbide; a trench that penetrates the well region from a surface of the source region and reaches the drift region; a gate electrode that is formed inside the trench through a gate insulating film; a source electrode that is connected to the well region and the source region; a drain electrode that is formed on a second main surface while being in contact with the silicon carbide semiconductor substrate, the second main surface being a surface opposite to the first main surface of the silicon carbide semiconductor substrate; and a high-concentration well region of the second conductivity type that is formed in the well region and has an impurity concentration higher than that of the well region. A low-channel doped region is formed in the well region on a first sidewall surface side of the trench, and a high-channel doped region having an effective acceptor concentration lower than that of the low-channel doped region is formed in the well region on a second sidewall surface side of the trench.

A method for manufacturing a silicon carbide semiconductor device includes: forming a drift region of a first conductivity type made of silicon carbide on a first main surface of a silicon carbide semiconductor substrate having an off-angle; forming a well region of a second conductivity type made of silicon carbide on a surface of the drift region; forming a source region of the first conductivity type made of silicon carbide selectively in a surface layer portion of the well region; forming a trench that penetrates the well region from a surface of the source region and reaches the drift region; forming a gate electrode inside the trench through a gate insulating film; forming a source electrode in contact with the well region and the source region; forming a drain electrode on a second main surface being a surface opposite to the first main surface of the silicon carbide semiconductor substrate; forming a low-channel doped region on a first sidewall surface side of the trench in the well region; and forming a high-channel doped region having an effective acceptor concentration lower than that of the low-channel doped region on a second sidewall surface side of the trench in the well region.

Effects of the Invention

According to the present invention, an ON state of each sidewall surface of a trench can be adjusted, so that a current concentration in a channel surface of a field-effect transistor formed in a particular sidewall surface of the trench can be prevented. Thus, a trench-gate silicon carbide semiconductor device having lower resistance or a silicon carbide semiconductor device having higher operational stability and higher reliability can be obtained.

DESCRIPTION OF EMBODIMENTS

Embodiment 1

First, a configuration of a silicon carbide semiconductor device in a first embodiment of the present invention will be described. Herein, it will be described assuming that a first conductivity type is an n-type and a second conductivity type is a p-type.

Figure 1:
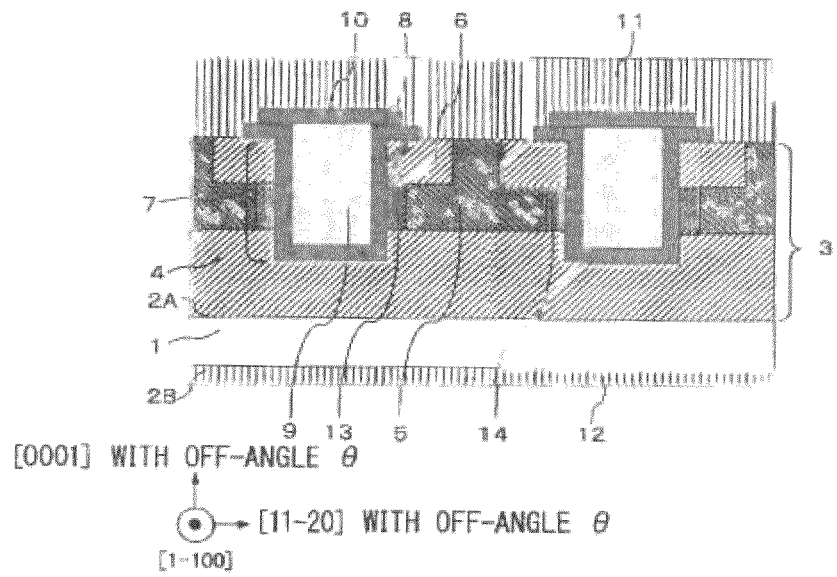
FIG. 1 is a cross-sectional view schematically showing a silicon carbide semiconductor device in a first embodiment of the present invention.
Figure 2:
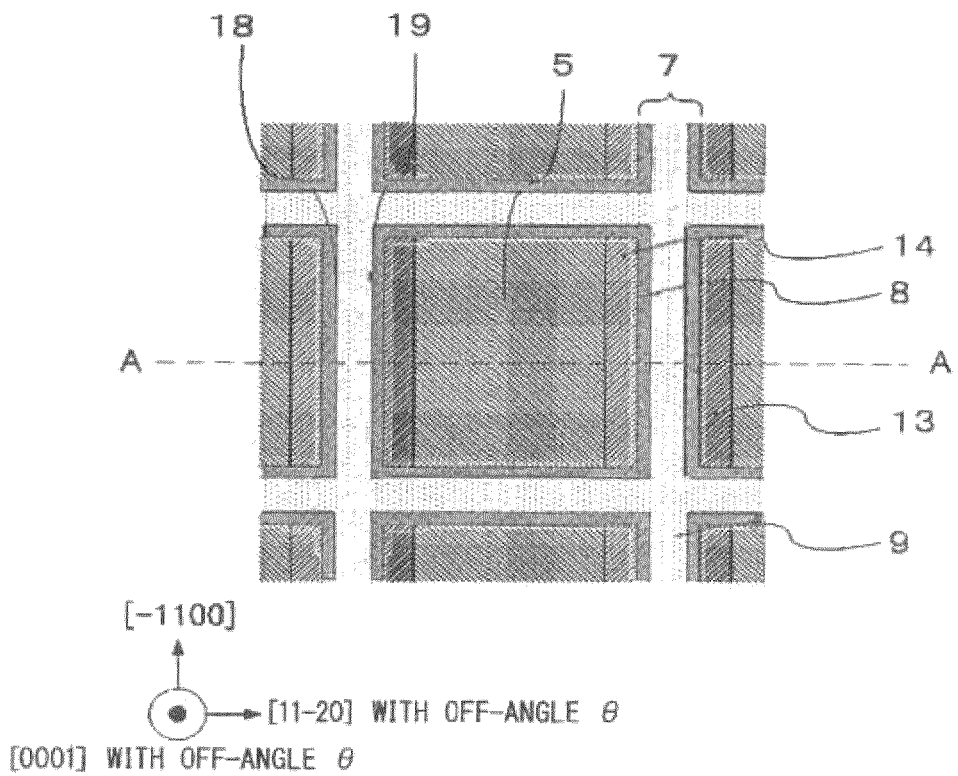
FIG. 2 is a plan view schematically showing the silicon carbide semiconductor device in the first embodiment of the present invention.

FIG. 1 is a cross-sectional view schematically showing the silicon carbide semiconductor device in the first embodiment of the present invention. FIG. 2 is a plan view schematically showing the configuration of the silicon carbide semiconductor device in FIG. 1. FIG. 1 is a cross-sectional view of an A-A broken line portion in FIG. 2. The silicon carbide semiconductor device in FIG. 1 and FIG. 2 is a vertical trench-gate MOSFET.

In FIG. 1, a drift region 4 of the n-type made of silicon carbide is formed on a first main surface 2A of a silicon carbide semiconductor substrate 1 that includes the first main surface 2A as a front surface and has a polytype of 4H, the first main surface 2A being tilted only an off-angle θ in an [11–20] axis direction to a (0001) plane. A well region 5 of the p-type made of silicon carbide is formed on a front surface of the drift region 4. A source region 6 of the n-type is selectively formed in a surface layer portion of the well region 5.

A trench 7 that penetrates the well region 5 from the front surface of the source region 6 and reaches the drift region 4 is formed. A gate electrode 9 is formed so as to be embedded in the trench 7 through a gate insulating film 8 inside the trench 7. Moreover, an interlayer insulating film 10 is formed so as to cover the gate insulating film 8 and the gate electrode 9, and a source electrode 11 is formed in a position in which part of the interlayer insulating film 10 is removed so as to be in contact with the source region 6 and the well region 5. Furthermore, a drain electrode 12 is formed so as to be in contact with a second main surface 2B being a surface opposite to the first main surface 2A of the silicon carbide semiconductor substrate 1.

A low-channel doped region 14 is formed in the well region 5 in a range of a predetermined distance d from a first sidewall surface 18 of the trench 7, and a high-channel doped region 13 is formed in the well region 5 in a range of a predetermined distance d from a second sidewall surface 19 of the trench 7. Here, the first sidewall surface 18 and the second sidewall surface 19 are surfaces facing each other through the gate electrode 9 in the trench 7. In the high-channel doped region 13 and the low-channel doped region 14, the high-channel doped region 13 has an effective acceptor concentration lower than that of the low-channel doped region 14. Herein, the effective acceptor concentrations in the high-channel doped region 13 and the low-channel doped region 14 are a value in which a donor concentration is subtracted from the acceptor concentration in each of the regions. The effective acceptor concentration takes the positive value for the high-channel doped region 13 of the p-type and the low-channel doped region 14 thereof, and takes the negative value for the high-channel doped region 13 of the n-type and the low-channel doped region 14 thereof.

In addition, in FIG. 1, an upper side of the paper plane is a [0001] direction with the off-angle θ, and a right side of the paper plane is the [11–20] direction with the off-angle θ.

Also in FIG. 2, the gate electrode 9 is formed inside the trench 7 through the gate insulating film 8, the trench 7 being formed in a grid shape in a plan view.

In FIG. 2, the upper side of the paper plane is a [–1100] direction, and the right side of the paper plane is the [11–20] direction with the off-angle θ.

Figure 3:
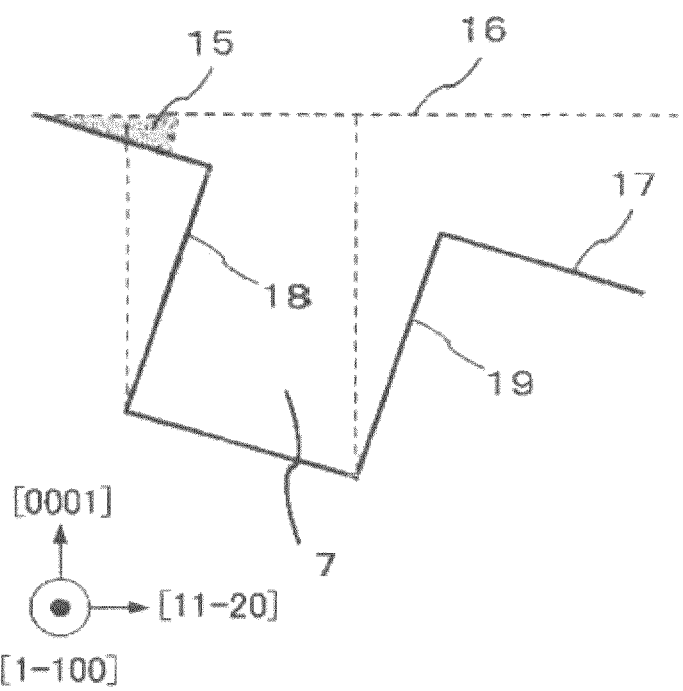
FIG. 3 is a schematic cross-sectional view for describing a relationship of a crystal surface of a trench in the silicon carbide semiconductor device in the first embodiment of the present invention.

Here, regarding the first sidewall surface 18 and the second sidewall surface 19 of the trench 7, a relationship of a crystal surface is described with reference to FIG. 3. FIG. 3 is a schematic cross-sectional view for describing the relationship of the crystal surface of the trench in the first embodiment of the present invention.

In FIG. 3, the upper side of the paper plane is the [0001] direction, the right side of the paper plane is the [11–20] direction, a surface 16 is exactly the (0001) plane, a surface 17 is the (0001) plane having the off-angle 9, and an angle 15 is the off-angle θ.

The silicon carbide semiconductor substrate 1 in this embodiment has the first main surface 2A, as the front surface, being tilted the off-angle θ in the [11–20] direction to the (0001) plane, so that in the trench 7 of the trench-gate MOSFET in this embodiment, the first main surface 2A corresponds to the surface 17 in FIG. 3, and the first sidewall surface 18 and the second sidewall surface 19 respectively correspond to a surface 18 and a surface 19 in FIG. 3.

In the relationship as described above, the first sidewall surface 18 and the second sidewall surface 19 of the trench 7 of the trench-gate MOSFET in this embodiment are a (11–20) plane having the off-angle θ and a (–1–120) plane having the off-angle θ, respectively.

For the sidewall surfaces of the trench 7 being a (1–100) plane and a (–1100) plane that are respectively orthogonal to the first sidewall surface 18 and the second sidewall surface 19 in FIG. 2, the effective acceptor concentration in the well region 5 on the side wall sides of the trench 7 is set to a value between that in the high-channel doped region 13 and that in the low-channel doped region 14.

Next, an operation of the trench-gate MOSFET being the silicon carbide semiconductor device in this embodiment of the present invention will be described in detail.

Figure 4:
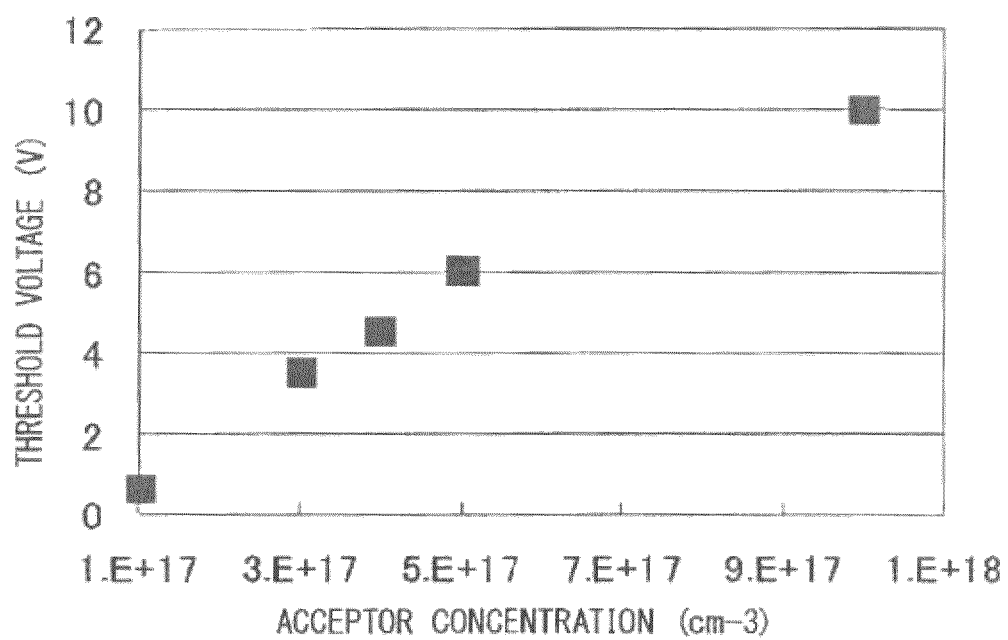
FIG. 4 is a diagram for describing a dependence of a threshold voltage of a MOSFET formed in a side wall of the trench on an acceptor concentration in a well region, regarding the silicon carbide semiconductor device in the first embodiment of the present invention.

FIG. 4 is a result of performing a device simulation of a relationship between the acceptor concentration and a threshold voltage in the well region 5, in cases where five different acceptor concentrations in the well region 5 are $1\times10^{17}/cm^3$, $3\times10^{17}/cm^3$, $4\times10^{17}/cm^3$, $5\times10^{17}/cm^3$, and $1\times10^{18}/cm^3$ while the trench 7 has a depth of 1.2 μm, the gate insulating film 8 is $SiO_2$ having a thickness of 50 nm, and the well region 5 has a depth of 0.9 μm.

Figure 5:
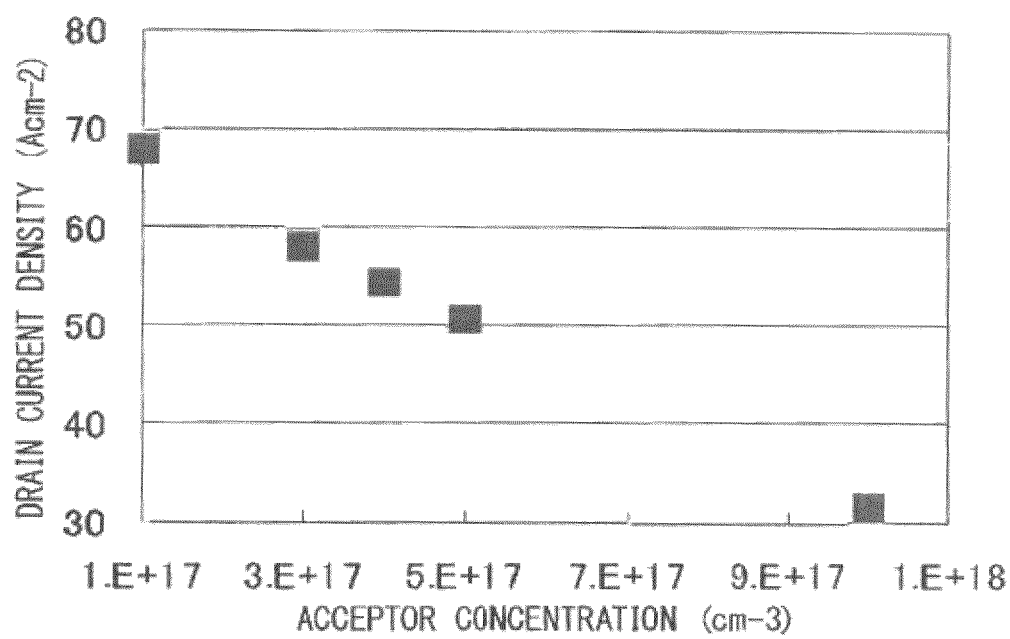
FIG. 5 is a diagram for describing a dependence of a drain current density of the MOSFET formed in the side wall of the trench on the acceptor concentration in the well region, regarding the silicon carbide semiconductor device in the first embodiment of the present invention.

FIG. 5 is a result of performing a device simulation of a drain current density when a gate voltage is 15 V for the acceptor concentration in the well region 5, in the trench-gate MOSFET combined as shown in FIG. 4.

As shown in FIG. 4, the threshold voltage increases with an increase in the acceptor concentration in the well region 5 that is to be an inversion channel layer. At this time, the threshold voltage changes in a range of 0.65 to 10 V.

Additionally, as shown in FIG. 5, the drain current density changes in a range of 32 to 68 $A/cm^2$ with the increase in the acceptor concentration in the well region 5 that is to be the inversion channel layer.

These results can be described as results of the change in a fermi level close to a conductive channel region formed in the well region 5 in the sidewall surfaces of the trench 7 in an ON state of the MOSFET by changing the acceptor concentration in the well region 5 that is to be the inversion channel layer.

Thus, the results in FIG. 4 and FIG. 5 indicate that the ON states of the sidewall surfaces of the trench 7 can be adjusted by adjusting the acceptor concentration in the well region 5 close to the sidewall surfaces of the trench 7.

Patent Document 1 discloses that a threshold voltage is fluctuated by a surface of a trench, and the threshold voltage of a field-effect transistor formed in each of the sidewall surfaces of the trench 7 can be leveled out by taking the contents of Patent Document 1 and the results of FIGS. 4 and 5 into consideration. For the sidewall surface of the trench 7 in which the threshold voltage of the field-effect transistor increases when the acceptor concentration in the well region 5 is a constant value, the acceptor concentration in the well region 5 close to the sidewall surface of the trench 7 is reduced, that is to say, the high-channel doped region 13 is formed. For the sidewall surface of the trench 7 in which the threshold voltage of the field-effect transistor decreases when the acceptor concentration in the well region 5 is a constant value, the acceptor concentration in the well region 5 close to the sidewall surface of the trench 7 is increased, that is to say, the low-channel doped region 14 is formed. In this manner, the trench-gate MOSFET having the identical threshold voltages in each of the inner wall surfaces of the trench 7 can be formed.

Next, a method for manufacturing the trench-gate MOSFET being the silicon carbide semiconductor device in this embodiment of the present invention will be described using FIGS. 6 to 11.

Figure 6:
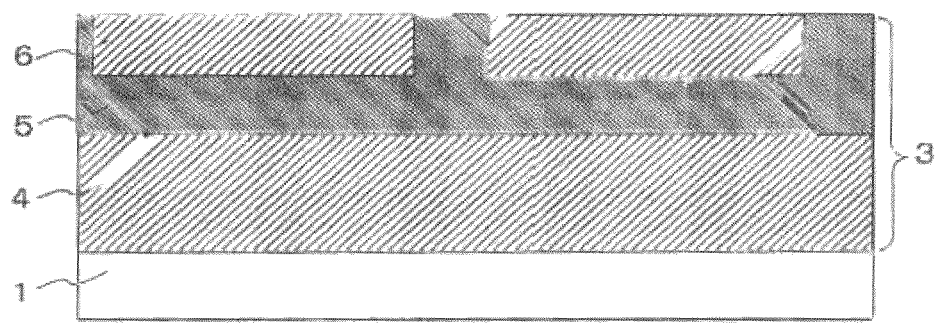
FIG. 6 is a schematic cross-sectional view schematically showing a method for manufacturing the silicon carbide semiconductor device in the first embodiment of the present invention.

First, an epitaxial layer 3 of the n-type that is made of silicon carbide and has relatively high resistance is epitaxially grown on the silicon carbide semiconductor substrate 1 of the n-type that includes the surface, as the front surface, tilted only the off-angle θ in the [11–20] axis direction to the (0001) plane and has the polytype of 4H. Then, an alignment mark, which is not shown, is formed by a reactive ion etching method (RIE method). Subsequently, the well region 5 of the p-type, the source region 6 of the n-type having the low resistance, and a well contact region of the p-type having the low resistance, which is not shown, are formed on the front surface of the epitaxial layer 3 by an ion implantation with reference to the alignment mark. The epitaxial layer 3 in which the well region 5 or the like is not formed is to be the drift region 4. As a result, the structure whose cross-sectional view is shown in FIG. 6 is formed. At this time, the source region 6 may be formed of a donor impurity concentration of $1\times10^{19}/cm^3$ or more, the well region 5 may be formed of an acceptor impurity concentration of approximately $1\times10^{16}/cm^3$ to $1\times10^{18}/cm^3$, and the well contact region may be formed of the acceptor impurity concentration of $1\times10^{20}/cm^3$ or more.

Figure 7:
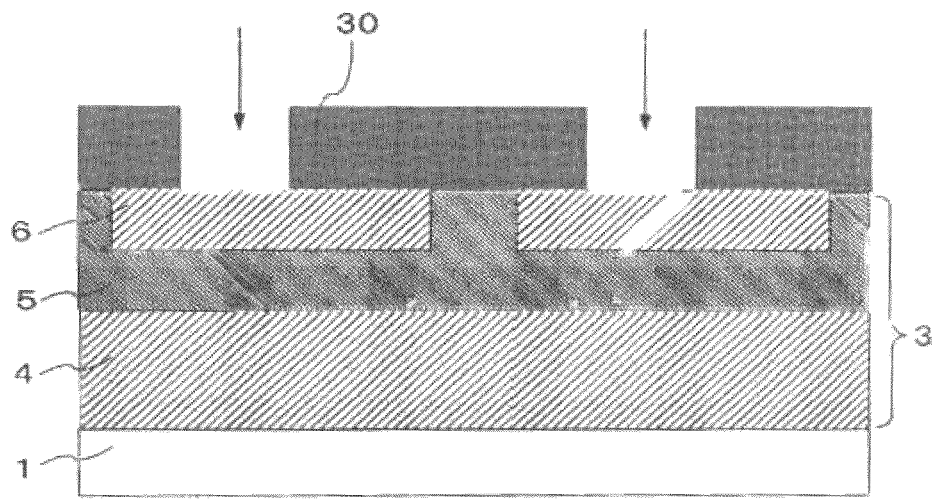
FIG. 7 is a schematic cross-sectional view schematically showing the method for manufacturing the silicon carbide semiconductor device in the first embodiment of the present invention.

Subsequently, as shown in FIG. 7, a resist mask 30 is formed on a predetermined portion, and the low-channel doped region 14 is formed by the ion implantation. The low-channel doped region 14 may be formed by ion-implanting donor-type impurities or by implanting acceptor-type impurities. Additionally, it may be formed before the formation of the well region 5. After the ion implantation, the resist mask 30 is removed.

Figure 8:
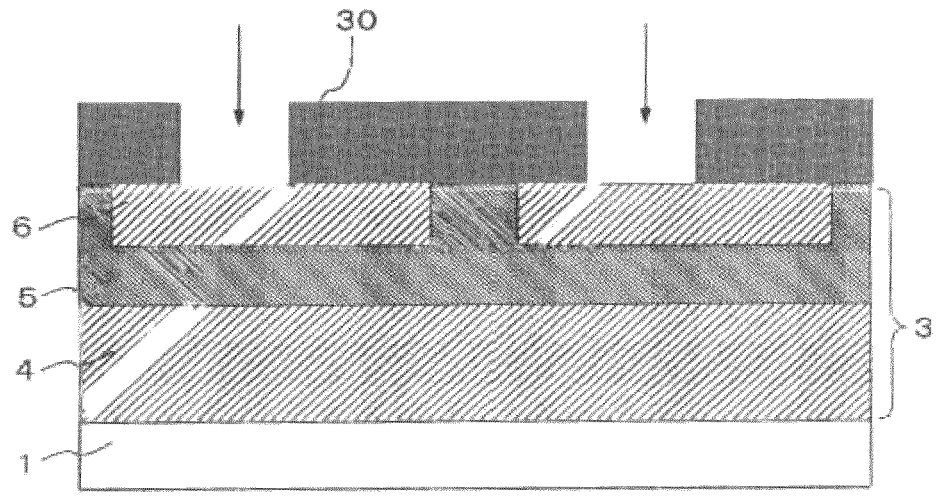
FIG. 8 is a schematic cross-sectional view schematically showing the method for manufacturing the silicon carbide semiconductor device in the first embodiment of the present invention.

Nest, as shown in FIG. 8, a resist mask 31 is formed on a predetermined portion, and the high-channel doped region 13 is formed by the ion implantation. The high-channel doped region 13 may also be formed by ion-implanting the donor-type impurities or by implanting the acceptor-type impurities.

Additionally, the formation order of forming the well region 5 and forming the low-channel doped region 14 may be changed. After the ion implantation, the resist mask 31 is removed.

Figure 9:
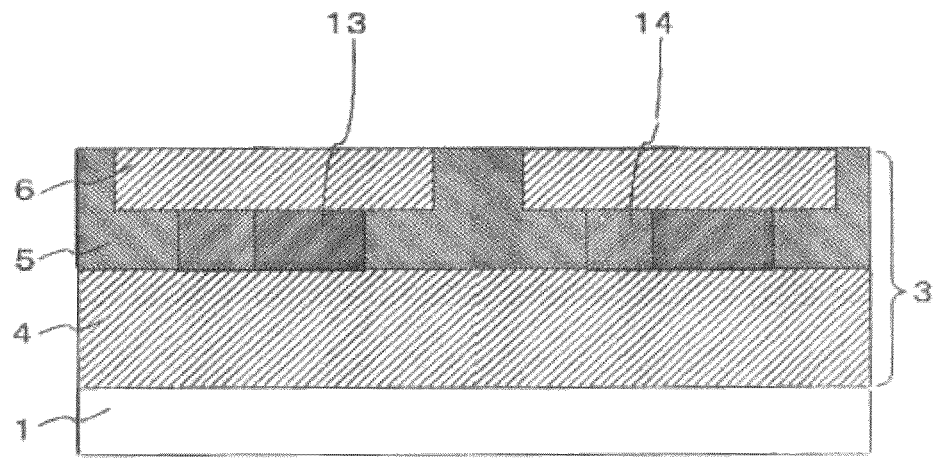
FIG. 9 is a schematic cross-sectional view schematically showing the method for manufacturing the silicon carbide semiconductor device in the first embodiment of the present invention.

In this manner, the structure whose schematic cross-sectional view is shown in FIG. 9 is formed.

Figure 10:
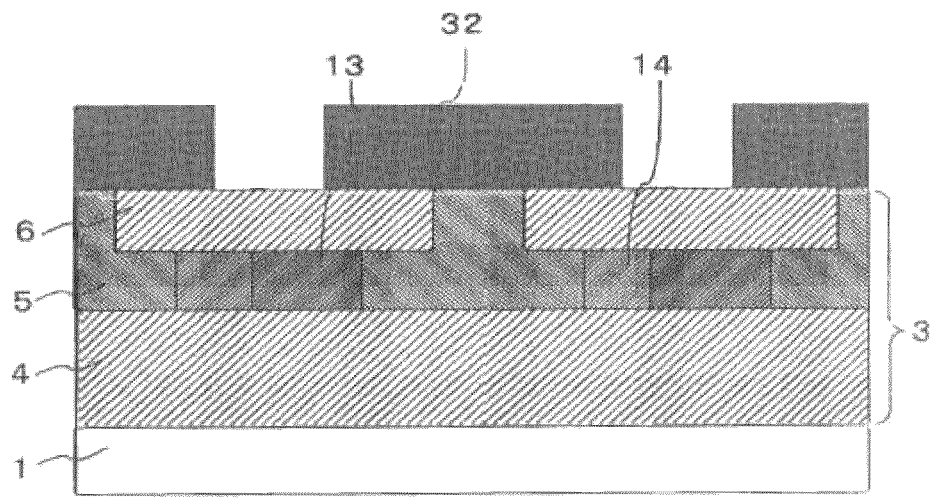
FIG. 10 is a schematic cross-sectional view schematically showing the method for manufacturing the silicon carbide semiconductor device in the first embodiment of the present invention.
Figure 11:
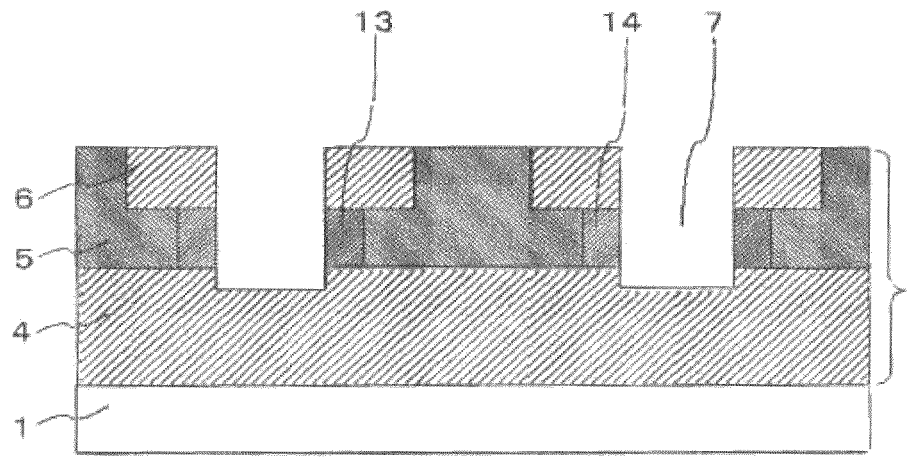
FIG. 11 is a schematic cross-sectional view schematically showing one aspect of the method for manufacturing the silicon carbide semiconductor device in the first embodiment of the present invention.

Subsequently, as shown in a schematic cross-sectional view in FIG. 10, another resist mask 32 for forming a trench 7 is formed. After the resist mask 32 is formed, the trench 7 is formed by the RIE method so as to have a depth deeper than that of the well region 5 and to reach the drift region 4. Next, as shown in FIG. 11, the resist mask 32 is removed. Then, an activation annealing in a temperature range of 1500 to 2200° C. and in a range of 0.5 to 60 minutes is performed. Next, the gate insulating film 8 made of $SiO_2$ having a thickness of approximately 50 nm and the gate electrode 9 made of a doped polysilicon material are successively formed inside the trench 7. A source electrode 11 is formed on the upper portion of the well contact region of the p-type and the drain electrode 12 is formed on a back surface of the substrate 1, whereby the trench-gate MOSFET that is the silicon carbide semiconductor device having the cell structure as shown in FIG. 1 can be manufactured. Here, the well contact region of the p-type is part of the well region 5, and the well region 5 is connected to the source electrode 11.

Figure 12:
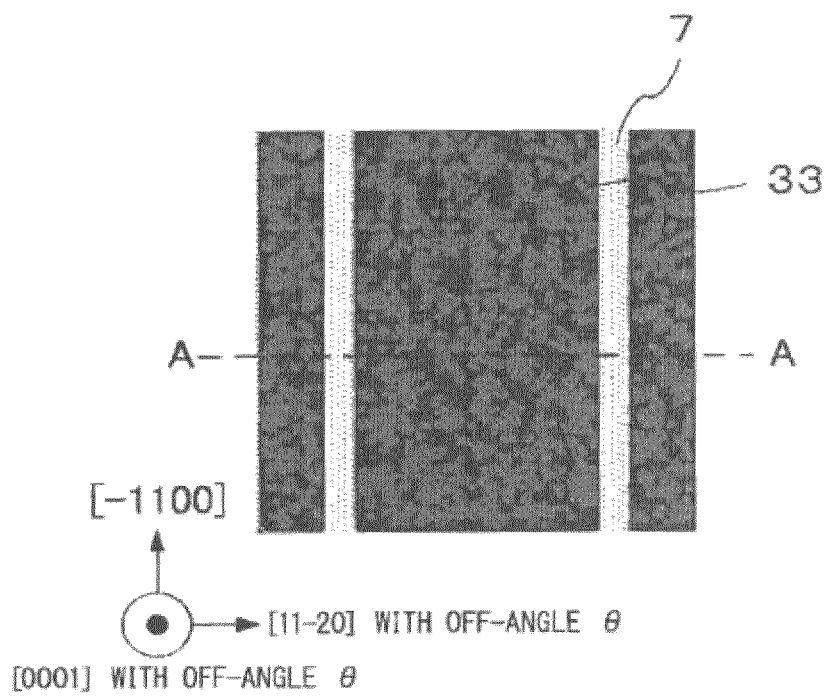
FIG. 12 is a schematic cross-sectional view schematically showing one aspect of the method for manufacturing the silicon carbide semiconductor device in the first embodiment of the present invention.

In addition, the high-channel doped region 13 and the low-channel doped region 14 may be formed after the trench 7 is etched. In other words, after the step in FIG. 6, a resist mask 33 having a stripe pattern as shown in FIG. 12 in a plan view is formed. Next, the resist mask 33 is used to etch the trench 7 into the stripe shape. Subsequently, as shown in a schematic cross-sectional view in FIG. 13, an oblique ion implantation is performed from sides in a direction orthogonal to the stripe direction of the trench 7 having the stripe shape to each form the high-channel doped region 13 and the low-channel doped region 14. At this time, a mark 25 is formed in a mark forming region 24 simultaneously with the formation of the trench 7.

Figure 13:
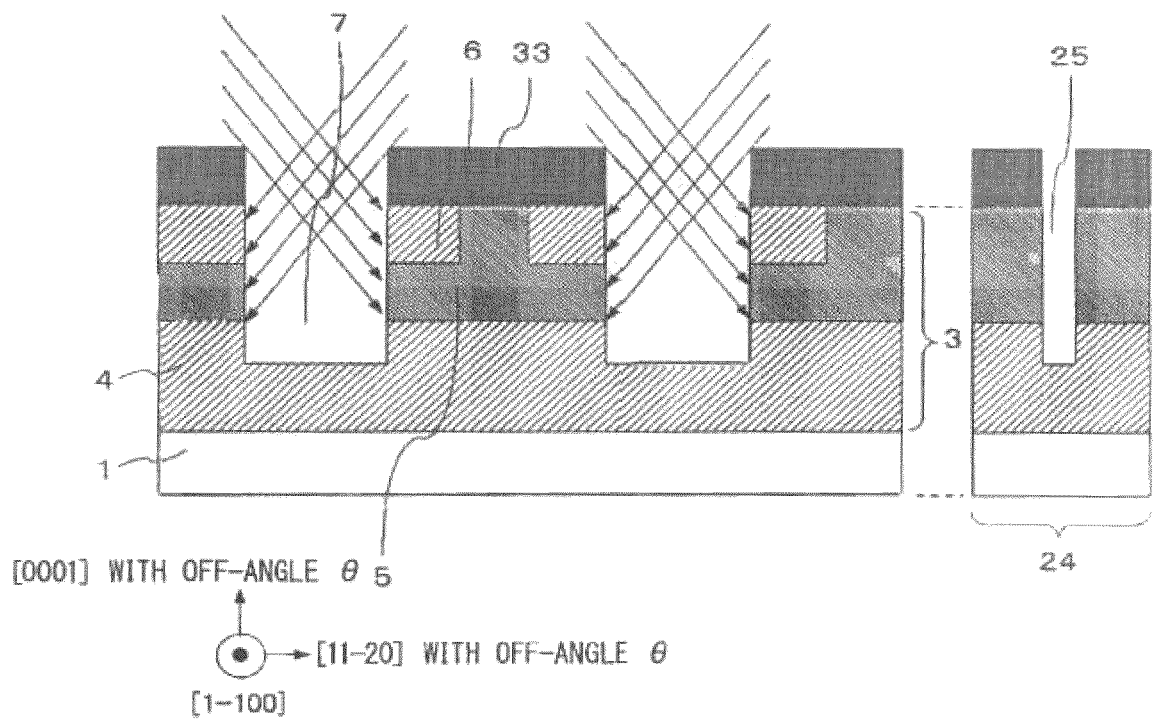
FIG. 13 is a schematic cross-sectional view schematically showing one aspect of the method for manufacturing the silicon carbide semiconductor device in the first embodiment of the present invention.
Figure 14:
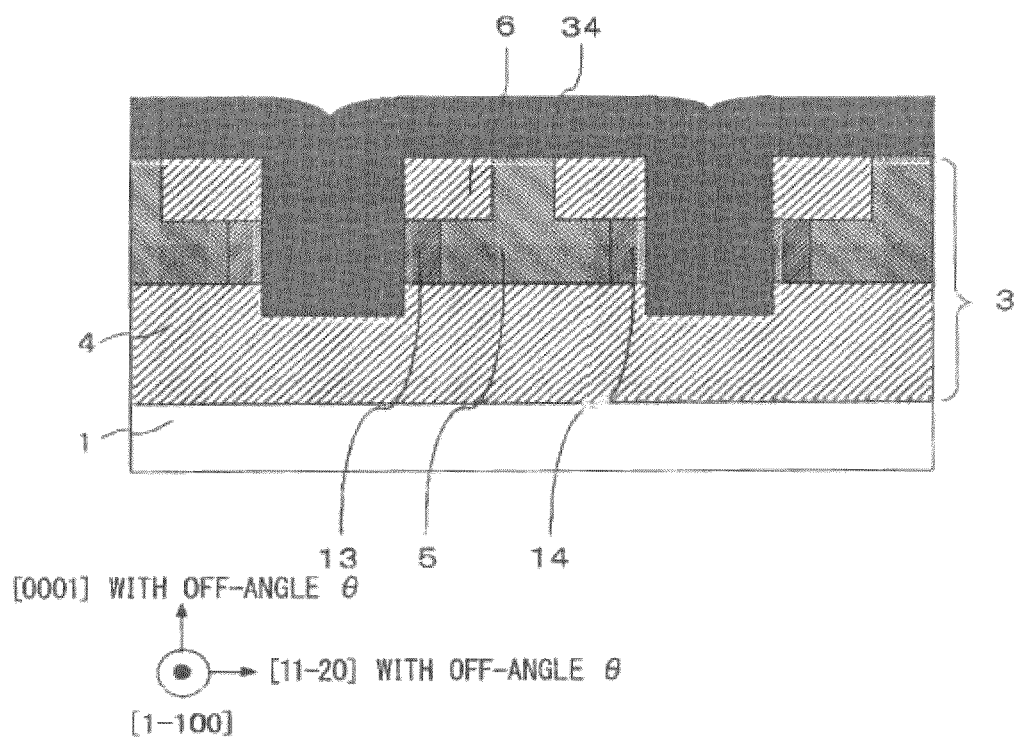
FIG. 14 is a schematic cross-sectional view schematically showing one aspect of the method for manufacturing the silicon carbide semiconductor device in the first embodiment of the present invention.
Figure 15:
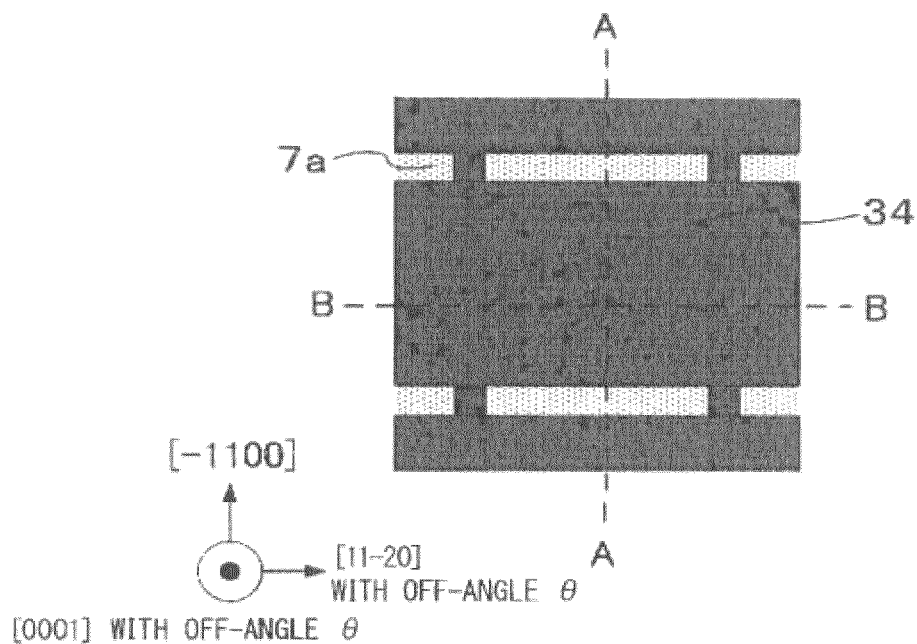
FIG. 15 is a schematic cross-sectional view schematically showing one aspect of the method for manufacturing the silicon carbide semiconductor device in the first embodiment of the present invention.

After the trench 7 including the high-channel doped region 13 and the low-channel doped region 14 is formed, as shown in FIG. 14, a mask 34 is embedded for protection in the trench 7 having the stripe shape that has been formed. At this time, as shown in a plan view in FIG. 15, the mask 34 is formed such that a portion of a trench 7a orthogonal to the trench 7 that has been formed is an opening. Herein, FIG. 14 is the cross-sectional view taken along a B-B line in FIG. 15, and FIG. 13 is the cross-sectional view taken along an A-A line in FIG. 15.

When the mask 34 is formed, the mask 34 is formed with reference to the mark 25 that has been formed, so that the trenches 7, 7a in the grid shape can be accurately formed, and silicon carbide at grid points can be prevented from over-etching.

Furthermore, subsequent to this, the sidewall surfaces of the trench 7 being the (1–100) plane and the (–1100) plane may be caused to have a channel concentration different from that of the well region 5 by the oblique ion-implantation method.

In addition, in this embodiment, the first main surface 2A of the silicon carbide semiconductor substrate 1 is assumed to be the (0001) plane having the off-angle θ tilted in the [11–20] axis direction, but even in a case where the first main surface 2A is assumed to be a (000–1) plane having the off-angle θ tilted in the [11–20] axis direction, variations in the drain current and the threshold voltage due to the crystal surfaces of the sidewall surfaces of the trench 7 can be suppressed by manufacturing the trench-gate MOSFET having the similar cell structure.

Specifically, as regards each of the four sidewall surfaces of the trench 7 formed in the grid shape of the trench-gate MOSFET having the rectangular cell structure in the plan view, it is preferable that the low-channel doped region 14 is formed in the sidewall surface of the trench 7 tilted closest to the (11–20) plane that is tilted in the [11–20] axis direction and has the off-angle θ, and the high-channel doped region 13 is formed in the sidewall surface of the trench 7 tilted closest to the (–1–120) plane being the opposed surface that is tilted in the [11–20] axis direction and has the off-angle θ.

In the present invention, for the sake of convenience, the trench 7 is assumed to be formed perpendicularly to the first main surface 2A of the silicon carbide semiconductor substrate 1, namely, the front surface of the epitaxial layer 3, and effects similar to those when the sidewall surfaces of the trench 7 are perpendicular are obtained also in a trench-gate SiC-MOSFET in which the sidewall surfaces of the trench 7 have a tapered angle to some extent with respect to the first main surface 2A.

The off-angle of approximately 1° or more and 10° or less, for example, is effective. The off-angle exceeding 30° reduces the influence of the point of the present invention, so that the off-angle is 30° at most.

Figure 16:
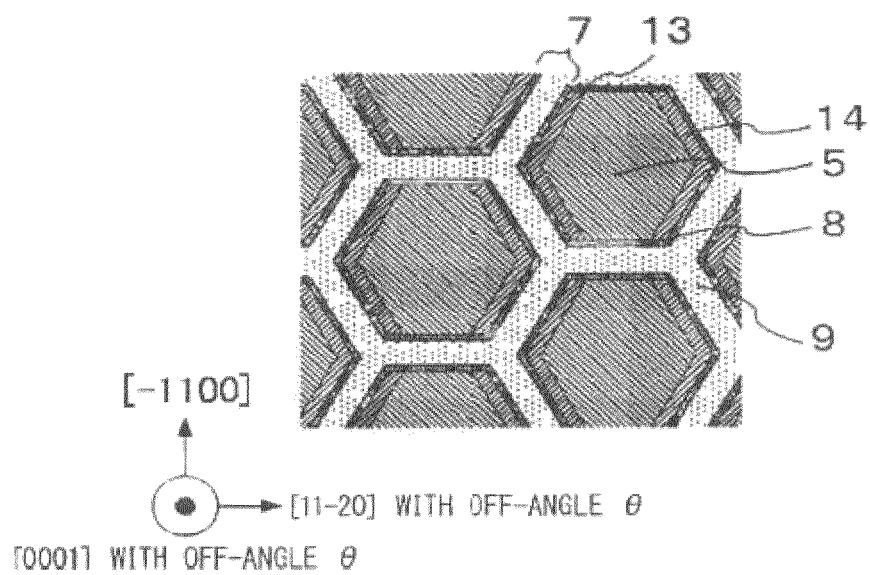
FIG. 16 is a plan view schematically showing one aspect of the silicon carbide semiconductor device in the first embodiment of the present invention.
Figure 17:
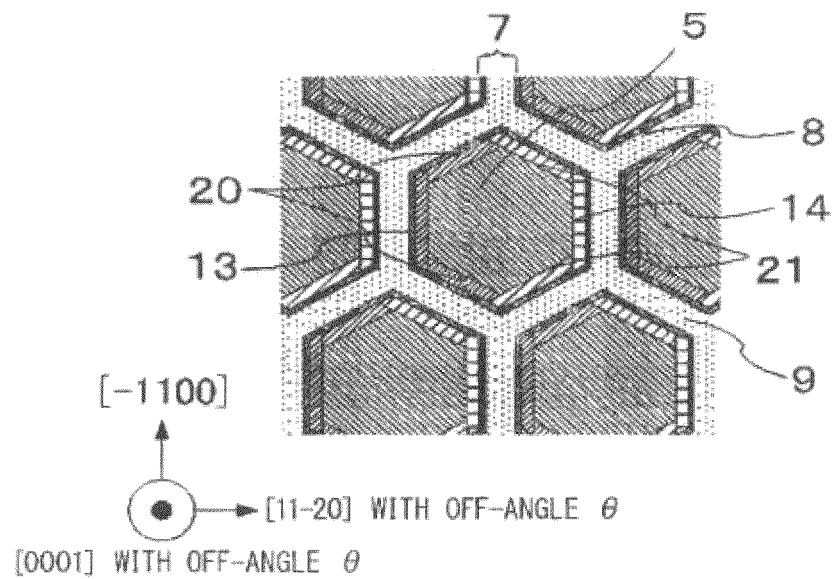
FIG. 17 is a plan view schematically showing one aspect of the silicon carbide semiconductor device in the first embodiment of the present invention.

Moreover, this embodiment gives descriptions with reference to the trench-gate MOSFET having the cell structure in the rectangular shape, such as a square, in the plan view, but the cell structure is not limited to this and may be a hexagonal cell structure in the plan view, as shown in plan views in FIG. 16 and FIG. 17. In FIG. 16, the low-channel doped region 14 is formed in two of the sidewall surfaces of the trench 7 close to the [11–20] axis direction, and the high-channel doped region 13 is formed in two of the sidewall surfaces of the trench 7 close to the direction opposite to the [11–20] axis direction. For example, the other surfaces (20, 21) in FIG. 17 may have the effective acceptor concentration set to a value between that of the low-channel doped region 14 and that of the high-channel doped region 13.

Figure 18:
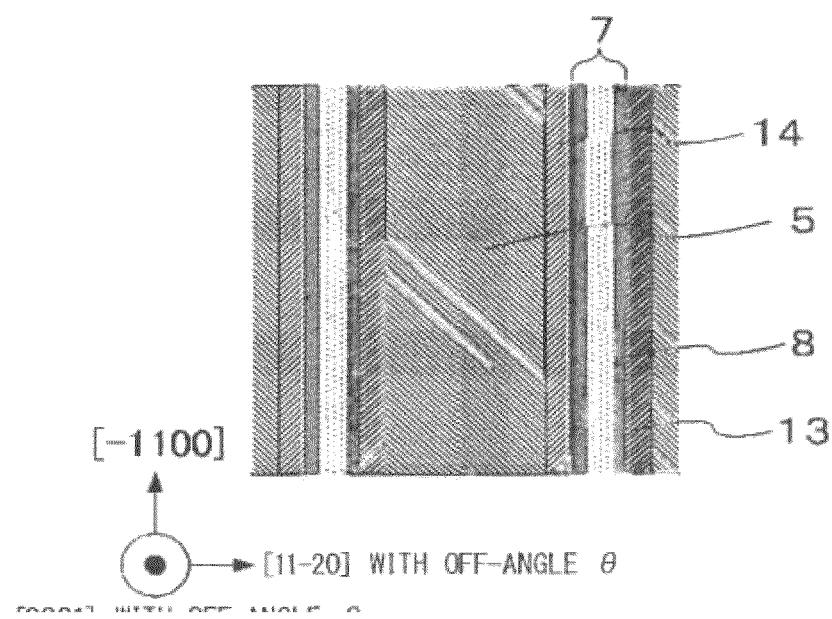
FIG. 18 is a plan view schematically showing one aspect of the silicon carbide semiconductor device in the first embodiment of the present invention.

Furthermore, a cell structure whose plan view is shown in FIG. 18 may have a stripe structure.

In this manner, effects similar to those when the cell structure has the rectangular shape can be obtained even if the cell structure is other than a rectangle.

Moreover, the high-channel doped region 13 and the low-channel doped region 14 may not necessarily be formed to have the same depth as that of the well region 5.

Figure 19:
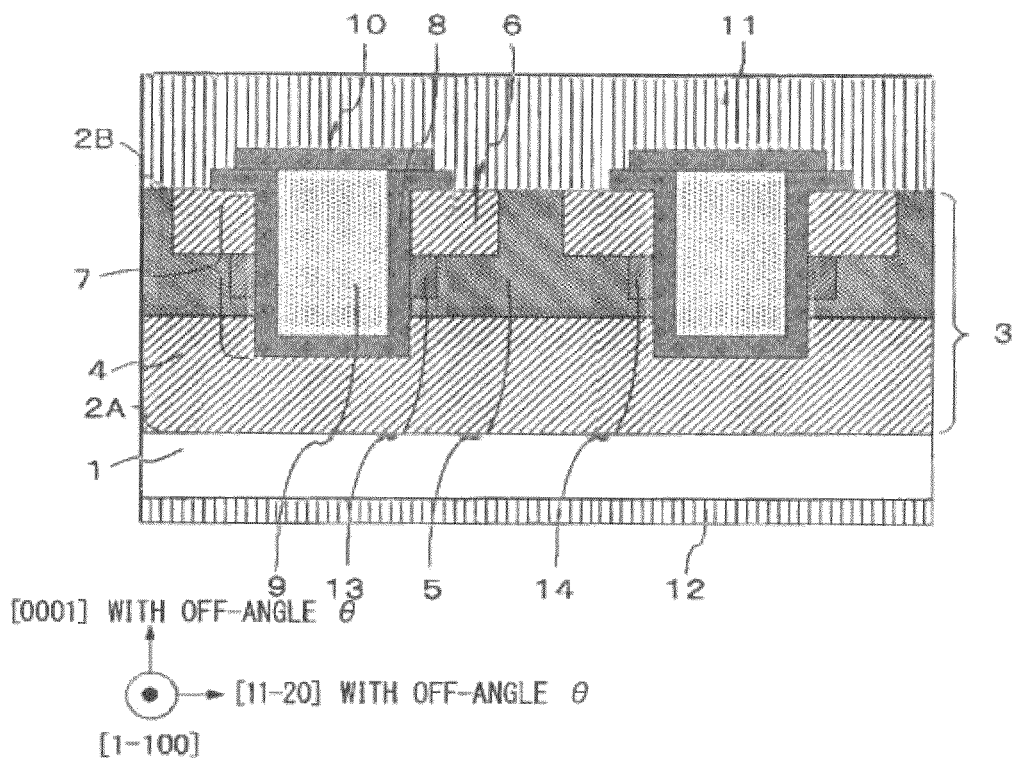
FIG. 19 is a plan view schematically showing one aspect of the silicon carbide semiconductor device in the first embodiment of the present invention.

For example, the bottom surfaces of the high-channel doped region 13 and the low-channel doped region 14 whose cross-sectional views are shown in FIG. 19 may be formed at a depth shallower than that of the bottom surface of the well region 5. The bottom surfaces of the high-channel doped region 13 and the low-channel doped region 14 whose cross-sectional views are shown in FIG. 20 may also be formed at a depth deeper than that of the bottom surface of the well region 5.

Figure 20:
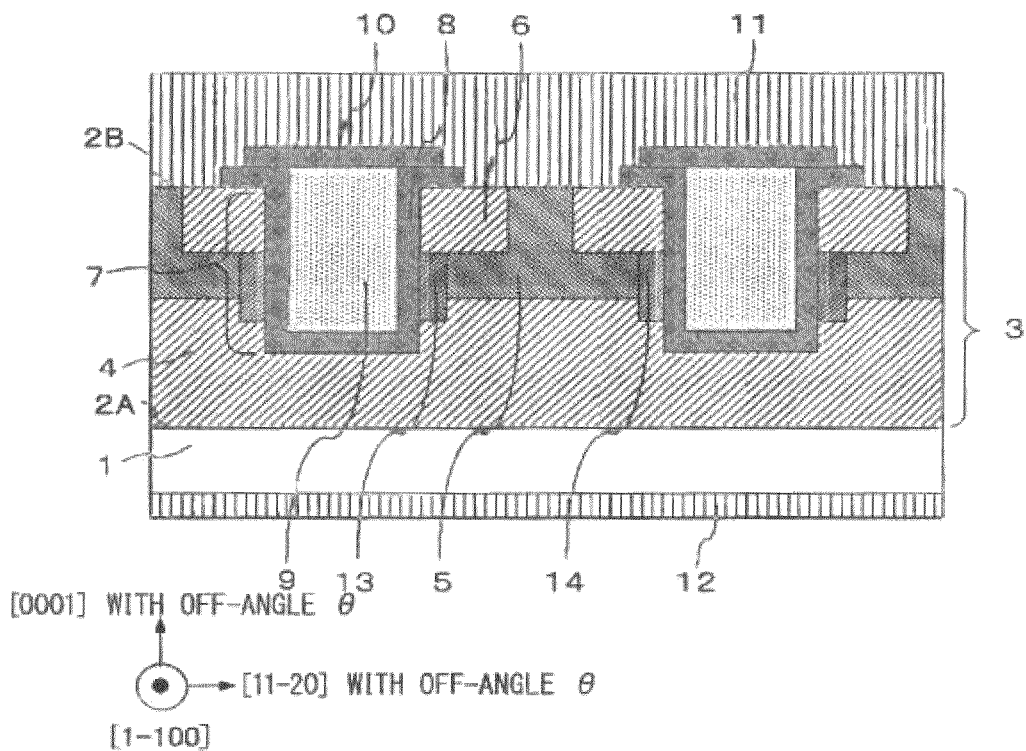
FIG. 20 is a cross-sectional view schematically showing one aspect of the silicon carbide semiconductor device in the first embodiment of the present invention.

As shown in FIGS. 19 and 20, the high-channel doped region 13 and the low-channel doped region 14 extend and contract, allowing for an adjustment to a saturated current density and a saturated voltage of the MOSFET.

Figure 21:
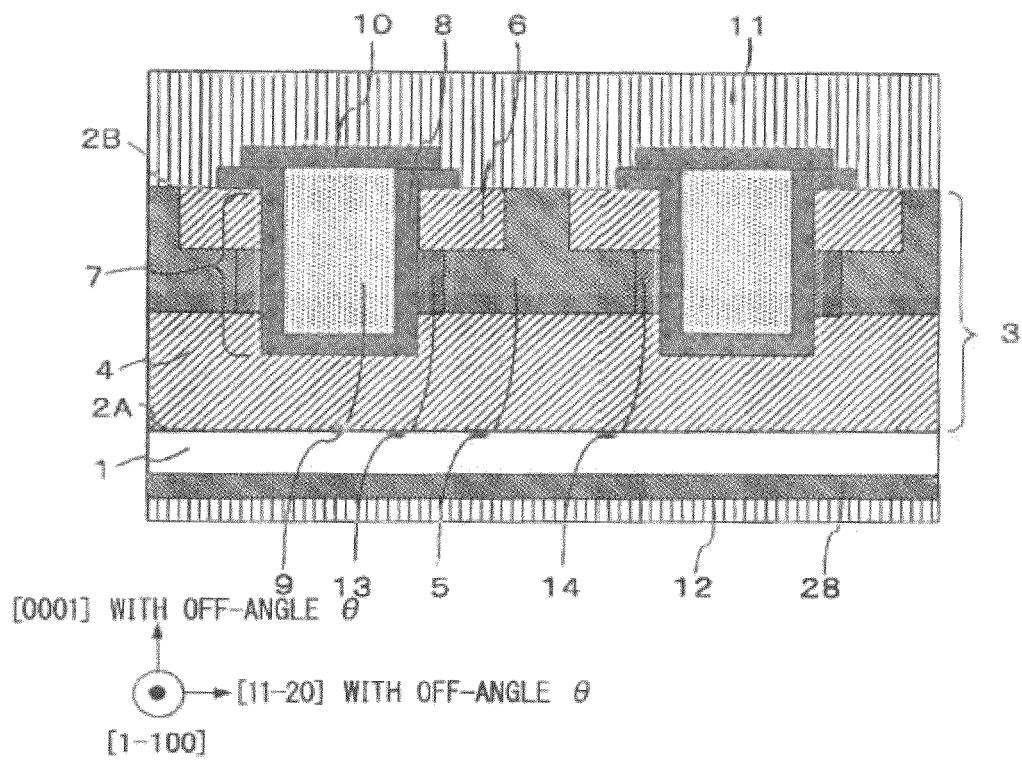
FIG. 21 is a cross-sectional view schematically showing one aspect of the silicon carbide semiconductor device in the first embodiment of the present invention.

In addition, this embodiment gives descriptions about the trench-gate MOSFET silicon carbide semiconductor device, and the present invention is not limited to the MOSFET. For example, as shown in a schematic cross-sectional view in FIG. 21, effects similar to those in the case of the MOSFET are obtained even if the present invention is an IGBT in which p-type impurities are implanted to the second main surface side of the silicon carbide semiconductor substrate 1 to form a back surface impurity region 28, or in which the silicon carbide semiconductor substrate 1 is the p-type.

In this manner, the application of the present invention can achieve the trench-gate SiC-IGBT having gate characteristics including a stable operation, a low leakage current in an OFF state, a low switching loss, and high reliability of noise. Further, a current concentration in a channel surface of the particular side surface of the trench 7 can be prevented, allowing for a low on-resistance.

In addition, in this embodiment, nitrogen, phosphorus, or the like may be used as n-type impurities, and aluminum, boron, or the like may be used as p-type impurities.

Embodiment 2

Figure 22:
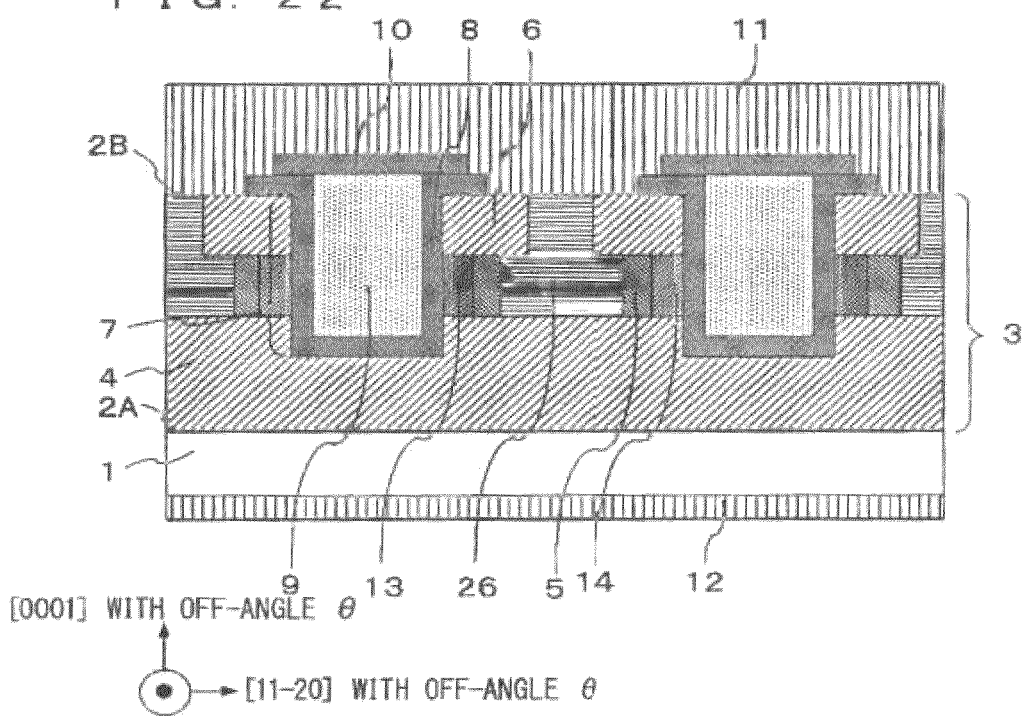
FIG. 22 is a cross-sectional view schematically showing one aspect of the silicon carbide semiconductor device in a second embodiment of the present invention.

A configuration of a trench-gate MOSFET being a silicon carbide semiconductor device in a second embodiment of the present invention will be described. FIG. 22 is a schematic cross-sectional view showing the trench-gate MOSFET being the silicon carbide semiconductor device in the second embodiment of the present invention.

In the semiconductor device in this embodiment, a high-concentration well region 26 having a p-type impurity concentration higher than that of the well region 5 is formed in the well region 5 in the silicon carbide semiconductor device in the first embodiment. The other portions are similar to those as described in the first embodiment, so that detailed descriptions will be omitted.

In FIG. 22, the side walls of the trench 7 facing each other cause the well region 5 in a horizontal direction in the diagram to have approximately the same width, the well region 5 not being the high-concentration well region 26. Then, to secure breakdown voltage in an OFF state of the silicon carbide semiconductor device, the p-type impurity concentration in the well region 5 needs to be set to a high concentration of approximately $1 \times 10^{18}/cm^3$ to $5 \times 10^{18}/cm^3$. Thus, the high-concentration well region 26 is provided in the well region 5 to secure the breakdown voltage in the OFF state regardless of the impurity concentrations in the high-channel doped region 13, the low-channel doped region 14, and the well region 5, whereby the threshold voltage and the drain current can be controlled more effectively.

In this manner, the trench-gate MOSFET being the silicon carbide semiconductor device in this embodiment can adjust the fermi level of the well region 5 independently of the breakdown voltage in the OFF state of the silicon carbide semiconductor device, so that the breakdown voltage in the OFF state can be secured while the threshold voltage can be controlled in a wider range.

Embodiment 3

Figure 23:
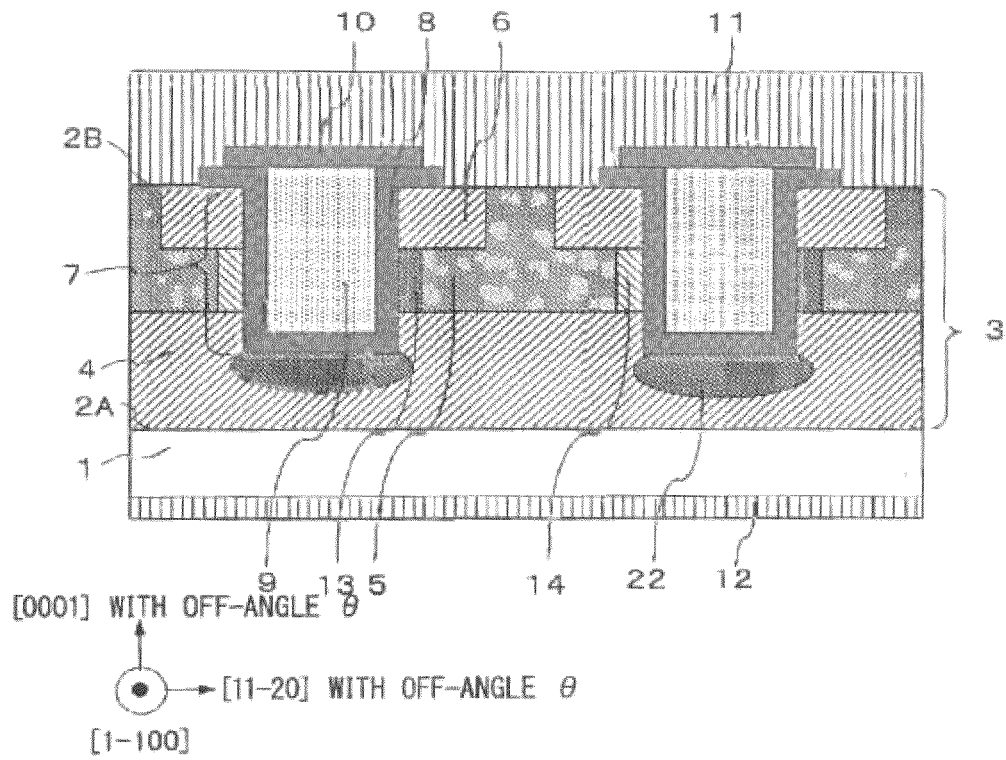
FIG. 23 is a cross-sectional view schematically showing one aspect of a silicon carbide semiconductor device in a third embodiment of the present invention.

A configuration of a trench-gate MOSFET being a silicon carbide semiconductor device in a third embodiment of the present invention will be described. FIG. 23 is a schematic cross-sectional view showing the trench-gate MOSFET being the silicon carbide semiconductor device in the third embodiment of the present invention.

In the semiconductor device in this embodiment, a trench bottom surface protecting well region 22 of a p-type is formed on the bottom of the trench 7 in the silicon carbide semiconductor device in the first embodiment. The other portions are similar to those as described in the first embodiment, so that detailed descriptions will be omitted here.

In this manner, the trench bottom surface protecting well region 22 of the p-type is formed on the bottom of the trench 7, whereby the application of the high voltage to the gate insulating film 8 on the bottom of the trench 7 can be suppressed.

Figure 24:
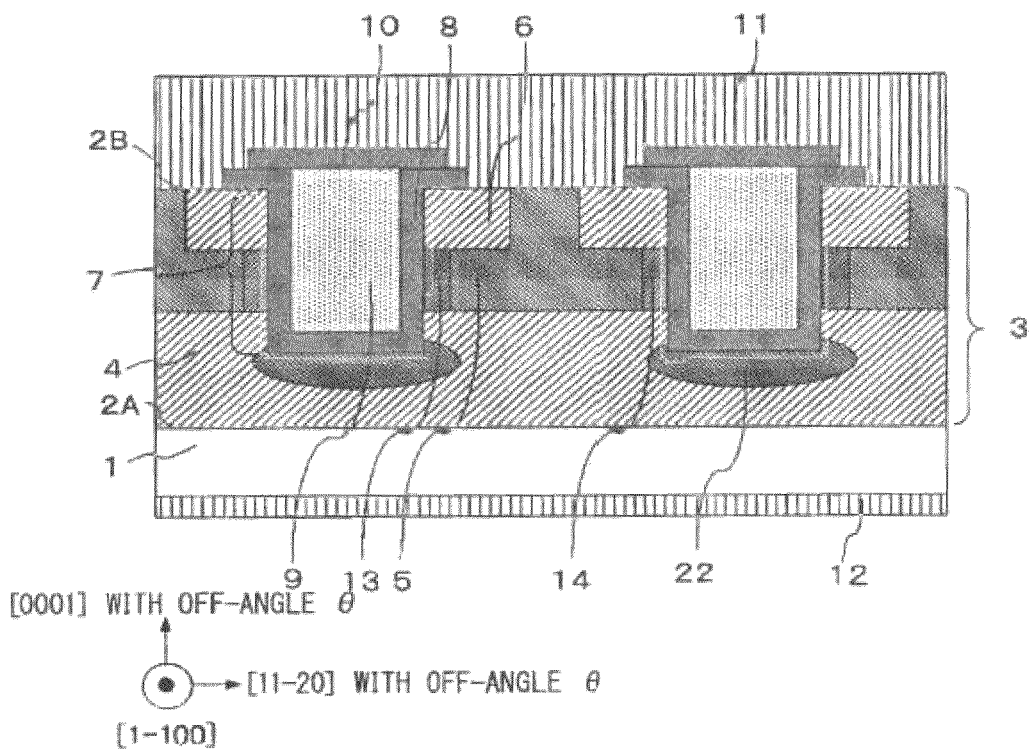
FIG. 24 is a cross-sectional view schematically showing one aspect of the silicon carbide semiconductor device in the third embodiment of the present invention.

Also as shown in a schematic cross-sectional view in FIG. 24, the trench bottom surface protecting well region 22 on the bottom of the trench 7 has different protruding distances from the sidewall surfaces of the trench 7 in the cross-sectional horizontal direction on the (11–20) plane side having the off-angle θ and on the (−1−120) plane side having the off-angle θ, and the protruding distance on the (11–20) plane side may be greater.

As in the present invention, the transistor characteristics are different in each of the side surfaces of the trench 7, so that punch-through breakdown voltage is different in each of the channel surfaces.

Therefore, the protruding distance of the trench bottom surface protecting well region 22 from the side surface of the trench 7 is determined according to the channel surface such that the surface closest to the (−1-120) plane that conceivably has the lowest punch-through breakdown voltage in particular has the greater protruding distance, whereby the application of the high voltage to the gate insulating film 8 on the bottom of the trench 7 can be suppressed, and the occurrence of the punch-through breakdown can be prevented.

Herein, it is preferable that the trench bottom surface protecting well region 22 has a second conductivity-type impurity concentration of approximately $1 \times 10^{17}/cm^3$ to $5 \times 10^{18}/cm^3$.

Moreover, the trench bottom surface protecting well region 22 can be formed by using the mask for forming the trench 7 to ion-implant the second conductivity-type impurities after the trench 7 is formed. To form the structure in FIG. 24, for example, the ion implantation of the second conductivity-type impurities may be slightly obliquely performed.

Furthermore, upon the ion implantation for the trench bottom surface protecting well region 22, an acceptor may be unintentionally implanted to the side surface of the trench 7 in some cases due to an effect of a reflection or the like of the implanted ion inside the trench 7. To remove the unintentional acceptor in the side surface of the trench 7, a sacrificial oxidation of the side surface of the trench 7 and a subsequent removal of an oxide film, or a thermal etching in an atmosphere containing hydrogen or chlorine may be performed after the ion implantation step.

In this manner, the structure of the trench-gate MOSFET in this embodiment can increase the protruding distance of the trench bottom surface protecting well region 22 from the side wall of the trench 7 and can suppress the punch-through breakdown more effectively, the trench bottom surface protecting well region 22 being formed on the lower portion of the side surface of the trench 7 tilted closest to the (−1-120) plane that conceivably has the lowest punch-through breakdown voltage.

In addition, the first to third embodiments give descriptions on the assumption that the first conductivity type is the n-type and the second conductivity type is the p-type, but this is not restrictive. The similar effects are obtained even if the first conductivity type is the p-type and the second conductivity type is the n-type.

In the MOSFETs described in the first to third embodiments, the gate insulating film is not necessarily an oxide film such as $SiO_2$, and it may be an insulating film except for the oxide film, or a combination of the insulating film except for the oxide film and the oxide film.

DESCRIPTION OF NUMERALS 1 silicon carbide semiconductor substrate; 3 epitaxial layer; 4 drift region; 5 well region; 6 source region; 7 trench; 8 gate insulating film; 9 gate electrode; 10 interlayer insulating film; 11 source electrode; 12 drain electrode; 13 high-channel doped region; 14 low-channel doped region; 18 first sidewall surface; 19 second sidewall surface; 22 trench bottom surface protecting well region; 25 mark; 26 high-concentration well region; 28 back surface impurity region; 30 to 34 resist mask, mask.

The invention claimed is:

1. A silicon carbide semiconductor device, comprising:
    a drift region of a first conductivity type that is formed on a first main surface of a silicon carbide semiconductor substrate having an off-angle and is made of silicon carbide;
    a well region of a second conductivity type that is formed on a surface of said drift region and is made of silicon carbide;
    a source region of the first conductivity type that is selectively formed in a surface layer portion of said well region and is made of silicon carbide;
    a trench that penetrates said well region from a surface of said source region and reaches said drift region;
    a gate electrode that is formed inside said trench through a gate insulating film;
    a source electrode that is connected to said well region and said source region;
    a drain electrode that is formed on a second main surface while being in contact with said silicon carbide semiconductor substrate, the second main surface being a surface opposite to the first main surface of said silicon carbide semiconductor substrate; and
    a high-concentration well region of the second conductivity type that is formed in said well region and has an impurity concentration higher than that of said well region,
    wherein
    a low-channel doped region is formed in said well region on a first sidewall surface side of said trench, and a high-channel doped region having an effective acceptor concentration lower than that of said low-channel doped region is formed in said well region on a second sidewall surface side of said trench, and
    said high-concentration well region is provided inside said well region at a distance from the side wall of said trench greater than a distance between said side wall and said low-channel doped region or said high-channel doped region.

2. The silicon carbide semiconductor device according to claim 1, wherein a width of said low-channel doped region from said first sidewall surface to said well region is the same as a width of said high-channel doped region from said second sidewall surface to said well region.

3. The silicon carbide semiconductor device according to claim 1, wherein said off-angle is 1° or more and 10° or less.

4. The silicon carbide semiconductor device according to claim 1, wherein said well region has a second conductivity-type impurity concentration of $1\times10^{16}/cm^3$ or more and $5\times10^{18}/cm^3$ or less.

5. The silicon carbide semiconductor device according to claim 1, wherein a trench bottom surface protecting well region is included in said drift region on a bottom of said trench.

6. The silicon carbide semiconductor device according to claim 2, wherein
    said first main surface has an off-angle tilted from a (0001) plane in an [11-20] axis direction,
    said first sidewall surface is a surface close to a (11-20) plane, and
    said second sidewall surface is a surface close to a (−1-120) plane.

7. The silicon carbide semiconductor device according to claim 5, wherein said trench bottom surface protecting well region has a greater protruding distance from the side wall of said trench on said first sidewall surface side than on said second sidewall surface side.

8. A method for manufacturing a silicon carbide semiconductor device, comprising:
    forming a drift region of a first conductivity type made of silicon carbide on a first main surface of a silicon carbide semiconductor substrate having an off-angle;
    forming a well region of a second conductivity type made of silicon carbide on a surface of said drift region;
    forming a source region of the first conductivity type made of silicon carbide selectively in a surface layer portion of said well region;
    forming a trench that penetrates said well region from a surface of said source region and reaches said drift region;
    forming a gate electrode inside said trench through a gate insulating film;
    forming a source electrode in contact with said well region and said source region;
    forming a drain electrode on a second main surface being a surface opposite to the first main surface of said silicon carbide semiconductor substrate;
    forming a low-channel doped region on a first sidewall surface side of said trench in said well region;
    forming a high-channel doped region having an effective acceptor concentration lower than that of said low-channel doped region on a second sidewall surface side of said trench in said well region, and
    forming a high-concentration well region of the second conductivity type that has a second conductivity-type impurity concentration higher than that of said well region inside said well region at a distance from the side wall of said trench greater than a distance between said side wall and said low-channel doped region or said high-channel doped region.

9. The method for manufacturing a silicon carbide semiconductor device according to claim 8, wherein said trench is formed after said low-channel doped region or said high-channel doped region is formed.

10. The method for manufacturing a silicon carbide semiconductor device according to claim 8, wherein after a first trench having a stripe shape is formed by etching, an ion implantation is performed obliquely from a direction orthogonal to the stripe direction of said first trench to form said low-channel doped region or said high-channel doped region, and subsequently, a mask that entirely covers said first trench is formed, and a second trench orthogonal to said first trench is etched.

11. The method for manufacturing a silicon carbide semiconductor device according to claim 8, further comprising forming a trench bottom surface protecting well region of the second conductivity type on a bottom surface of said trench, wherein ion is implanted to said trench bottom surface protecting well region by tilting an ion angle of an ion implantation to the first sidewall surface side after said trench is formed.

* * * * *